United States Patent
Lee

(10) Patent No.: US 6,316,298 B1
(45) Date of Patent: Nov. 13, 2001

(54) FABRICATION METHOD FOR A FLASH MEMORY DEVICE

(75) Inventor: Chien-Hsing Lee, Chupei (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/535,023

(22) Filed: Mar. 24, 2000

(30) Foreign Application Priority Data

Oct. 22, 1999 (TW) .................................................. 88118300

(51) Int. Cl.[7] .................................................. H01L 21/338

(52) U.S. Cl. .......................... 438/179; 438/257; 438/267

(58) Field of Search .................................... 438/179, 257, 438/266

(56) References Cited

U.S. PATENT DOCUMENTS 6,051,860 * 4/2000 Odanaka et al. ...................... 257/316

* cited by examiner

Primary Examiner—Charles Bowers
Assistant Examiner—William M. Brewster
(74) Attorney, Agent, or Firm—Thomas, Kayden, Horstemeyer & Risley

(57) ABSTRACT

A method for fabricating a flash memory device is described. A plurality of gates structures are formed on a substrate and each gate structure has a gate oxide layer. A floating gate is formed on the gate oxide layer. A cap layer is formed on the floating gate, and a spacer is formed on the sidewalls of the cap layer, the floating gate and the gate oxide layer. Thereafter, a trench is formed in every other space between the gate structures. A source region is formed on one side of the gate structure at the bottom of the trench in the substrate. Concurrently, a drain region is formed on another side of the gate structure in the substrate. After this, the cap layer and the spacer are removed, followed by forming a conformal dielectric layer on the substrate. A conductive layer is further formed on the substrate.

13 Claims, 3 Drawing Sheets

FABRICATION METHOD FOR A FLASH MEMORY DEVICE

CROSS-REFERENCE TO RELATED APPLICATION

This application claims the priority benefit of Taiwan application serial no. 88118300, filed Oct. 22, 1999.

BACKGROUND OF THE INVENTION

1. Field of the Invention

The present invention relates to a fabrication method for a flash memory device. More particularly, the present invention relates to a fabrication method for a split-gate flash memory device.

2. Description of the Related Art

In general, the conventional structure of an erasable programmable read-only memory (EPROM) device is similar to that of the N-type metal-oxide-semiconductor (MOS), wherein the gate structure is the stacked gate type, comprising a polysilicon floating gate for charge storage and a control gate to control the storage and retrieval of information. Thus a typical EPROM unit comprises two gates, a floating gate and the underlying control gate. The control gate is connected to the word line, while the floating gate is maintained in a "floating" condition and has no connection with the external circuits. At present, the most popular type of flash memory device has been developed by Intel Corporation, in which the erasure operation can be conducted "block by block", and the erasure speed is fast. The erasure operation is completed in 1 to 2 seconds, greatly reducing the time and the cost of operation. The traditional stacked gate structure of the flash memory device, wherein the floating gate and the control gate are stacked on each other, often result in the problem of an over-erasure during the flash-memory device erasure operation.

To resolve the over-erasure problem in the traditional stacked gate structure of a flash memory device, a split gate flash memory device is being developed.

FIG. 1 is a schematic, cross-sectional view of a split-gate flash-memory device according to the prior art. The structure of the split-gate flash memory device includes a substrate 100, comprising a source region 102a and a drain region 102b. On the substrate 100 is a gate oxide layer 104, wherein a floating gate 106, a dielectric layer 108 and a control gate 110 are on the gate oxide layer 104.

The conventional flash memory device is formed by forming a source region 102a and a drain region 102b, respectively in the substrate 100. A dielectric layer (not shown) and a conductive layer (not shown) are formed on the substrate 100, immediately followed by a definition of the conductive layer and the dielectric layer to form a floating gate 106 and a gate oxide layer 104, respectively. The gate oxide layer 104 is formed on the substrate 100 at a side of the source region 102a or the drain region 102b, partially covering either the source region 102a or the drain region 102b.

The operation conditions of a conventional split-gate flash-memory device are summarized in Table 1.

TABLE 1

Operation Conditions of a Conventional Split-Gate Flash-Memory Device.

| Operations | Control Gate | Bit Line (Drain Region) | Source Region | Substrate |
|---|---|---|---|---|
| Programming | 8–12 V | 3–8 V | GND | GND |
| Erasure | GND | GND | GND | >15V |
| Reading | Vcc | 1–2 V | GND | GND |

In a split gate flash memory device, the control gate 110 and the floating gate 106 are not completely stacked on each other, the problem of an excessive erasure as in the conventional stacked gate is thereby obviated. As the device dimensions are continuously being reduced, the distance between the source region 102a and the drain region 102b, however, also decreases. A short channel between the source region 102a and the drain region 102b is results, easily leading to the punch through effect. The dimensions of a split-gate flash-memory device, as a result, cannot be scaled-down.

SUMMARY OF THE INVENTION

Based on the foregoing, the current invention provides a fabrication method for a flash memory device wherein a substrate comprising a plurality of gate structures is provided. Each gate structure further comprises a gate oxide layer and an overlying floating gate, wherein a cap layer is formed on the floating gate. A spacer is further formed on the sidewalls of the cap layer, the floating gate and the gate oxide layer. Thereafter, trenches are formed in the exposed substrate not covered by the spacer and the cap layer, wherein the trenches are about 0.1 micron to 1 micron deep. A source region is then formed at the bottom of the trenches in the substrate by one side of the gate structure, and a drain region is formed on the other side of the gate structure in the substrate. The cap layers and the spacers are subsequently removed, followed by forming a conformal dielectric layer on the substrate. After this, a conductive layer is formed on the substrate.

Since the depth of the trench is about equal to the channel length of the split gate transistor, the channel length of the split gate transistor will not be affected by the shrinkage of the device dimensions because the source region is located deep in the substrate at the bottom of the trench. The punch through effect due to a reduction of the device dimension in the conventional practice is thus prevented.

Furthermore, the source region and the drain region are formed in the substrate after the formation of the floating gate; the fabrication of the floating gate thus has a greater processing window.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2F are schematic, cross-sectional views showing the manufacturing of a flash memory device according to the present invention. FIG. 2G is a cross-sectional view of FIG. 2F along the dash line I—I.

Figure 1:
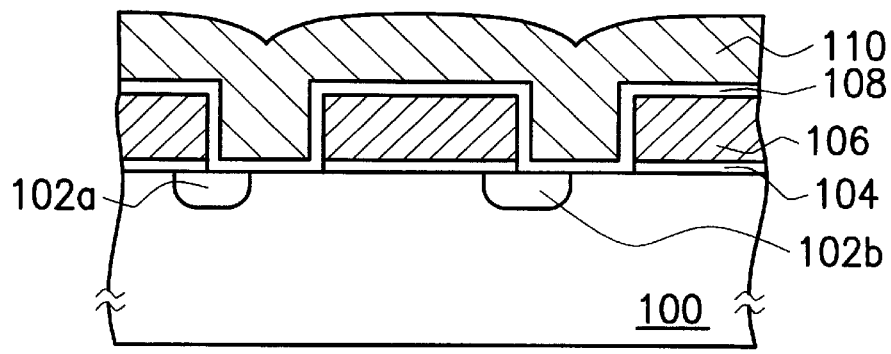
FIG. 1 is a schematic, cross-sectional view of a split-gate flash memory device according to the prior art.
Figure 2A:
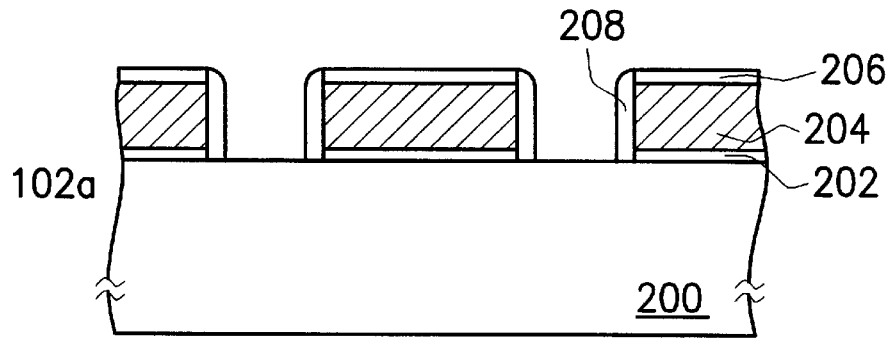
FIGS. 2A to 2F are schematic, cross-sectional views showing the manufacturing of a flash memory device according to the present invention.

Referring to FIG. 2A, a gate structure, which comprises a gate oxide layer 202, a floating gate 204, a cap layer 206 and a spacer 208, is formed on the substrate 200. The gate structure is formed by, for example, sequentially forming a dielectric layer (not shown), a conductive layer (not shown) and a dielectric layer (not shown). Photolithography and etching are then conducted to define the dielectric layer, the conductive layer and the dielectric layer to form, respectively, a gate oxide layer 202, a floating gate 204 and a cap layer 206. A dielectric layer is further formed on the substrate 200, followed by performing an etching process, for example, anisotropic etching until the cap layer 206 and the surface of the substrate 200 are exposed to form a spacer 208 on the sidewalls of the gate oxide layer 202, the floating gate 204 and the cap layer 206. The floating gate 204 is, for example, polysilicon. The cap layer is, for example, silicon nitride or silicon oxide, and the spacer 208 is, for example, silicon oxide.

Figure 2B:
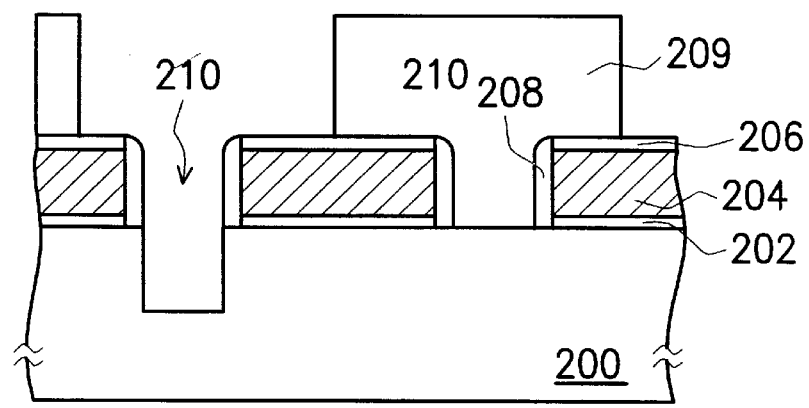

As shown in FIG. 2B, a patterned photoresist layer 209 is formed on the substrate 200. The patterned photoresist layer 209 exposes a substrate 200 surface on one side of the gate structure. A trench 210 is then formed on the exposed substrate 200 on one side of the gate structure. The trench 210 is formed by, for example, conducting anisotropic etching on the substrate 200 while using a patterned photoresist 209, cap layer 206 and spacer 208 as masks. In other words, the trench 210 is formed on one side of the gate and is formed in the space between the gate structures. Furthermore, the trench 210 is about 0.1 micron to 1 micron deep, and the depth of the trench 210 is about equal to the channel length of the subsequently formed split gate transistor (which transistor is formed with the split type control gate, a split type gate dielectric layer and the substrate).

Figure 2C:
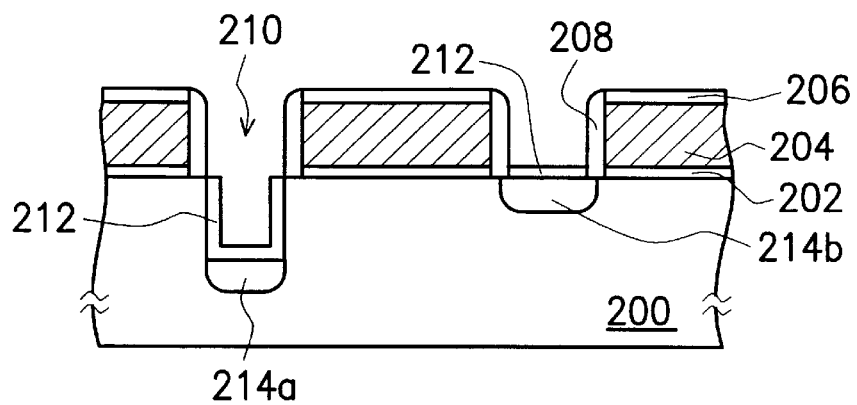

After this, as shown in FIG. 2C, the photoresist 209 (as in FIG. 2B) is removed, followed by conducting a self-aligned oxidation process to form a dielectric layer 212 on the exposed substrate 200 surface of the trench 210, wherein the dielectric layer 212 is, for example, silicon oxide.

Using the cap layer 206 and the spacer 208 as masks, an ion implantation is conducted to form a source region 214a in the substrate 200 at the bottom of the trench 210 under a part of the dielectric layer 212. A drain region 214b is concurrently formed between the gate structures in the substrate 200 under the dielectric layer 212. Consequently, an alternating structure is formed with the source region 214a in the substrate at the bottom of the trench 210, the gate structure, the drain region 214b and another gate structure.

The ion implantation is accomplished by doping ions vertically into the surface of the substrate 200. The doping energy is about 20 KeV to about 100 KeV. If the implanted dopant is arsenic or phosphorous, the implanted dosage is about $5 \times 10^{14}$ atoms/cm$^2$ to about $1.0 \times 10^{16}$ atoms/cm$^2$. Furthermore, the source region 214a also serves as a buried bit line.

After this, a threshold voltage adjustment implantation is conducted, in which the dopant is implanted at a tilted angle into the substrate 200. If the dopants for the source region 214a and the drain region 214b are boron ions, the doping energy is about 50 KeV and the dosage is about $1 \times 10^{12}$ atoms/cm$^2$ to about $5 \times 10^{13}$ atoms/cm$^2$. Since a dielectric layer 212 is formed on the surface of the substrate 210 that is not covered by the gate structures, the exposed substrate 200 in the trenches 210 is prevented from being damaged during ion implantation of the source region 214a and the drain region 214b and the threshold voltage adjustment implantation.

Figure 2D:
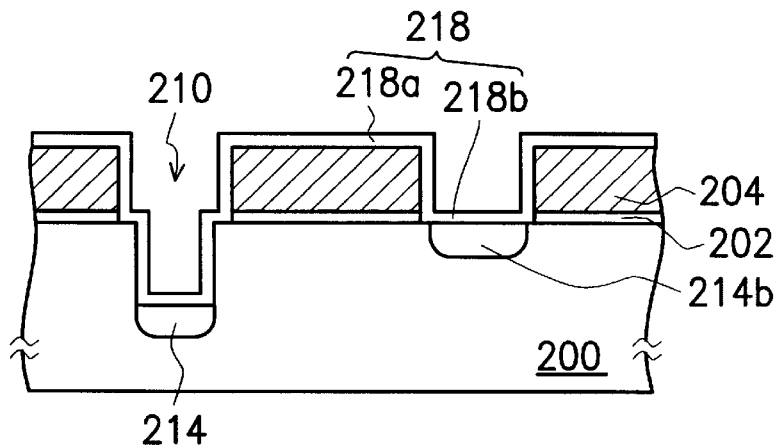

Continuing to FIG. 2D, the spacer 208, the dielectric layer 212 and the cap layer 206 are removed. When the spacer 208, the dielectric layer 212 and the cap layer are silicon oxide, wet etching is conducted using, for example, an etchant solution containing hydrogen fluoride (HF) to remove these structures. On the other hand, when the spacer 208, the dielectric layer 212 and the cap layer 206 are silicon nitride, wet etching is conducted using, for example, hot phosphoric acid as an etchant.

After this, a conformal dielectric layer 218 is formed on the substrate 200. The dielectric layer 218 includes the inner polysilicon dielectric layer 218a on the top surface and the sidewalls of the floating gate 204, and the split gate dielectric layer 218b on the exposed part of the substrate 200 surface not covered by the floating gates 204. The inner polysilicon dielectric layer 218a and the split gate dielectric layer 218b can form concurrently or separately and they can be of different materials. The inner polysilicon dielectric layer 218a is, for example, a silicon oxide-silicon nitride-silicon oxide layer; and the split gate dielectric layer 218b is, for example, polysilicon.

Figure 2E:
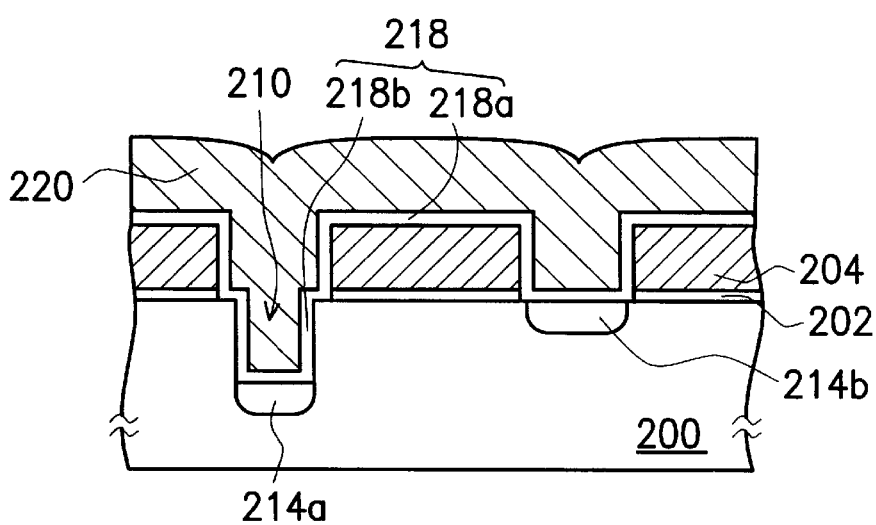

Continuing to FIG. 2E, a conductive layer 220 is formed on the substrate 200, filling the trenches 210 and the space between the floating gates.

Figure 2F:
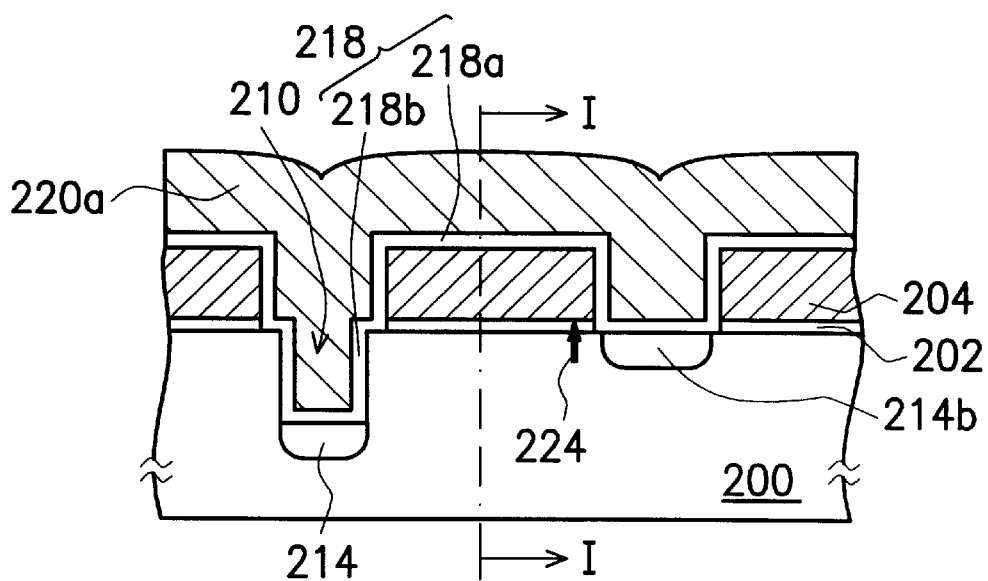
Figure 2G:
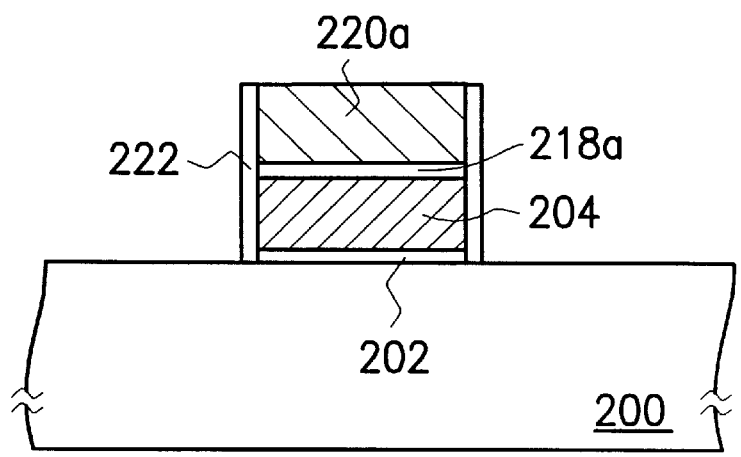
FIG. 2G is a cross-sectional view of FIG. 2F along the line I—I.

Referring to FIGS. 2F and 2G, the conductive layer 220 (as in FIG. 2E), the dielectric layer 218, and the floating gate 204 are defined, converting the conductive layer 220 into a control gate 220a. Thereafter, a dielectric layer 222 is formed on the sidewalls of the control gate 220a, the inner polysilicon dielectric layer 218a and the floating gate 204, sealing the floating gate 204 and electrically isolating the floating gate 204. The fabrication of a split-gate flash memory device is thus completed, wherein the split gate transistor is formed with a portion of the control gate 220a above the trench 210, the split gate dielectric layer 218b and the substrate 200.

The operating voltage conditions of the split-gate flash memory device formed according to the preferred embodiment of the present invention is summarized in Table 2.

TABLE 2

The Operating Voltages for the Split-Gate Flash Memory Device Formed According to the Preferred Embodiment of the Present Invention.

| Operations | Control Gate | Bit Line (Drain Region) | Source Region | Substrate |
|---|---|---|---|---|
| Programming | 1–10 V | 3–8 V | GND | GND |
| Erasure | GND | GND | GND | >15V |
| Reading | Vcc | 1–2 V | GND | GND |

Before the performance of the programming operation, the flash memory cell is over-erased and many positive charges are stored in the floating gate 204. During the programming operation, the split gate transistor is opened and hot electrons travel from the source region 214a along the border of the source region 214a. Near the border of the drain region 214b, the hot electrons penetrate vertically through the gate oxide layer 202 at the hot electron injection point indicated by the arrow 224 and inject into the floating gate 204.

Since the source/drain regions and the corresponding floating gate 204 form a symmetrical structure, the probability for hot electrons to travel from the two source/drain regions 214 into the floating gate is equal. As a results, two high electric field of the channel gaps between the control gate 220a overlying the trenches 210 and the floating gate 204 are provided, resulting in two high hot electron injection points, as indicated by arrows 224a and 224b, formed under the floating gate 204. Consequently, the flash memory device formed according to the present invention provides a lower programming current consumption, a higher electron injection efficiency and an improved operating speed. Furthermore, when compared to the flash memory device of the conventional practice, the programming operation of the flash memory device formed according to the present invention requires a lower operation voltage at the control gate, which is appropriate for programming operations of 2.5 V and below.

Since the depth of the trench 210 is related to and is about equal to the channel length of the split gate transistor, the channel length of the split gate transistor is thereby not affected by the reduction of the device dimension, even when the integration of a device increases and the dimension of the device decreases. The punch through effect between the source region 214a and the drain region 214b is thus prevented. In addition, during the programming operation with the flash memory device formed according to the preferred embodiment of the present invention, a lower control gate voltage is required, which is appropriate for a programming operation of 2.5 V and below.

According to the preferred embodiment of the present invention, the formation of the source region 214a and the drain region 214b in the exposed substrate 200 at the bottom of the trenches 210 is completed after the formation of the trenches 210 in the exposed substrate 200. The step of forming the trenches 210, in turns, is follows the formation of the gate oxide layer 202, the floating gate 204, the cap layer 206 and the spacer 208. Compared to the conventional practice in which the source region 214a and the drain region 214b are formed in the substrate 200 before the formation of the floating gate, the fabrication method of the present invention provides a larger processing window and a higher alignment accuracy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a flash memory device comprising the steps of:

providing a substrate with a plurality of gate structures wherein each gate structure comprises a gate oxide layer, a floating gate is positioned on the gate oxide layer with a cap layer on the floating gate, and a spacer is located on sidewalls of the cap layer, the floating gate and the gate oxide layer;

forming a patterned photoresist on the substrate;

forming a trench in the substrate on one side of the gate structure using the photoresist, the cap layer and the spacer as masks, wherein the trench is formed in every other space between the gate structures;

removing the patterned photoresist;

conducting a self-aligned oxidation process to form a first dielectric layer on the substrate;

forming a source region in the substrate under a part of the first dielectric layer at a bottom of the trench;

conducting a threshold voltage adjustment implantation;

removing the cap layer, the spacer and the first dielectric layer;

forming a conformal second dielectric layer on the substrate;

forming a conductive layer on the substrate;

defining the conductive layer, the second dielectric layer and the floating gate to convert the conductive layer into a control gate; and forming a third dielectric layer on sidewalls of the control gate, the second dielectric layer and the floating gate.

2. The fabrication method for a flash memory device according to claim 1, wherein the trench is about 0.1 micron to about 1 micron deep.

3. The fabrication method for a flash memory device according to claim 1, wherein the source/drain region is formed by doping ions vertically into a surface of the substrate to implant ions into the substrate.

4. The fabrication method for a flash memory device according to claim 3, wherein a doping energy is about 20 KeV to about 100 KeV.

5. The fabrication method for a flash memory device according to claim 3, wherein a dosage of the implanted ions is about $5 \times 10^{14}$ atoms/cm$^2$ to about $1.0 \times 10^{16}$ atoms/cm$^2$.

6. The fabrication method for a flash memory device according to claim 1, wherein a doping energy for the threshold voltage implantation process is about 50 KeV, and a dosage of the implanted ions is about $1 \times 10^{12}$ atoms/cm$^2$ to about $5.0 \times 10^{13}$ atoms/cm$^2$.

7. A fabrication method for a flash memory device comprising the steps of:

providing a substrate with a plurality of gate structures, wherein each gate structure comprises a gate oxide layer, a floating gate on the gate oxide layer, a cap layer on the floating gate, and a spacer on sidewalls of the cap layer, the floating gate and the gate oxide layer;

forming a trench in every other space between the gate structures;

forming a source region in the substrate at a bottom of the trench on one side of the gate structure and forming a drain region in the substrate on another side of the gate structure;

removing the cap layer and the spacer;

forming a conformal dielectric layer on the substrate; and forming a conductive layer on the substrate.

8. The fabrication method for a flash memory device according to claim 7, wherein the trench is about 0.1 micron to about 1 micron deep.

9. The fabrication method for a flash memory device according to claim 7, wherein the source region and the drain region are formed by doping ion vertically into a surface of the substrate to implant ion into the substrate.

10. The fabrication method for a flash memory device according to claim 9, wherein a doping energy is about 20 keV to 100 KeV.

11. The fabrication method for a flash memory device according to claim 9, wherein a dosage of the implanted ions is about $5 \times 10^{14}$ atoms/cm$^2$ to about $1 \times 10^{16}$ atoms/cm$^2$.

12. The fabrication method for a flash memory device according to claim 7, wherein after the formation of the source/drain region further includes performing a threshold voltage adjustment implantation process.

13. The fabrication method for a flash memory device according to claim 12, wherein a doping energy for the threshold voltage adjustment implantation process is about 50 KeV and a dosage of the implanted ions is about $1 \times 10^{12}$ atoms/cm$^2$ to $5.0 \times 10^{13}$ atoms/cm$^2$.

* * * * *